(12) United States Patent
Koyama

(10) Patent No.: US 6,946,996 B2
(45) Date of Patent: Sep. 20, 2005

(54) ANTENNA APPARATUS, PRINTED WIRING BOARD, PRINTED CIRCUIT BOARD, COMMUNICATION ADAPTER AND PORTABLE ELECTRONIC EQUIPMENT

(75) Inventor: Shunsuke Koyama, Chino (JP)

(73) Assignee: Seiko Epson Corporation (JP)

( * ) Notice: Subject to any disclaimer, the term of this patent is extended or adjusted under 35 U.S.C. 154(b) by 20 days.

(21) Appl. No.: 10/661,353

(22) Filed: Sep. 12, 2003

(65) Prior Publication Data

US 2004/0119654 A1 Jun. 24, 2004

(30) Foreign Application Priority Data

Sep. 12, 2002 (JP) ........................................ 2002-266323
Jun. 3, 2003 (JP) ........................................ 2003-157951

(51) Int. Cl.[7] .............................................. H01Q 1/38
(52) U.S. Cl. .............................. 343/700 MS; 343/702; 343/841; 343/846
(58) Field of Search ........................... 343/700 MS, 702, 343/841, 846, 848

(56) References Cited

U.S. PATENT DOCUMENTS

| | | | | |
|---|---|---|---|---|
| 4,924,237 A | * | 5/1990 | Honda et al. ................. 343/702 |
| 5,802,458 A | * | 9/1998 | Van Zeijl et al. .............. 455/90 |
| 6,147,652 A | | 11/2000 | Sekine ........................ 343/702 |
| 6,204,825 B1 | * | 3/2001 | Wilz ........................... 343/841 |
| 6,380,903 B1 | * | 4/2002 | Hayes et al. ................. 343/725 |
| 6,392,603 B1 | | 5/2002 | Kurz et al. ................... 343/702 |
| 6,466,170 B2 | * | 10/2002 | Zhou .................... 343/700 MS |
| 6,539,207 B1 | * | 3/2003 | del Castillo ................. 455/90 |
| 6,774,849 B2 | * | 8/2004 | Umehara et al. ..... 343/700 MS |
| 6,812,892 B2 | * | 11/2004 | Tai et al. ............. 343/700 MS |
| 6,819,287 B2 | * | 11/2004 | Sullivan et al. ...... 343/700 MS |
| 2002/0126047 A1 | | 9/2002 | Laureanti ..................... 343/702 |

FOREIGN PATENT DOCUMENTS

| | | |
|---|---|---|
| EP | 0757 405 | 2/1997 |
| JP | 03-175826 | 7/1991 |
| JP | 11-008508 | 1/1999 |

OTHER PUBLICATIONS

Communication from European Patent Office regarding counterpart application.

* cited by examiner

Primary Examiner—Tan Ho
(74) Attorney, Agent, or Firm—Harness, Dickey & Pierce, P.L.C.

(57) ABSTRACT

An antenna apparatus is provided that includes a printed wiring board, electronic components disposed on the printed wiring board, a shielding member (ground member) that is disposed on the printed wiring board. The shielding member has a length along a predetermined directional axis X set substantially to ¼λ or more, the wavelength of an electromagnetic wave used for communication being λ. An antenna element extends in a direction crossing the directional axis X and is grounded to the shielding member (ground member).

21 Claims, 24 Drawing Sheets

90

(a)

(c)

(b)

ANTENNA APPARATUS, PRINTED WIRING BOARD, PRINTED CIRCUIT BOARD, COMMUNICATION ADAPTER AND PORTABLE ELECTRONIC EQUIPMENT

BACKGROUND OF THE INVENTION

1. Technical Field

The present invention relates to an antenna apparatus, a printed wiring board, a printed circuit board, a communication adapter and portable electronic equipment, and more particularly, it relates to an antenna apparatus, a printed wiring board, a printed circuit board, a communication adapter and portable electronic equipment used for high-frequency radio equipment.

2. Related Art

Hitherto, a helical dipole antenna has been used as an antenna for portable equipment, such as a portable telephone, which is high-frequency radio equipment.

This helical dipole antenna has been constructed such that it is drawn out of the housing of portable equipment when it is used or it has been used while it is accommodated in the housing.

Japanese Unexamined Patent Application Publication No. 3-175826 discloses an antenna assembly having a second antenna in the housing of portable equipment separately from a helical dipole antenna. This construction makes it possible to create a diversity (spatial diversity or angular diversity) by the helical dipole antenna and the second antenna. As the second antenna, an inverted F antenna is generally used.

Thin portable equipment of 2.4 GHz band card type employs a chip antenna using ceramic.

To form an antenna for portable equipment on a printed wiring board, ideally, an ample space is preferably secured around an antenna element in order to secure characteristics. Generally, this has easily been implemented by forming the antenna element on a surface of the printed wiring board.

The conventional helical dipole antenna has been posing a problem in that it is large in principle, making it hardly applicable to wristwatch-size portable electronic equipment or the like required to be made smaller.

Furthermore, the inverted F antenna is constructed to implement its functions by its antenna element and ground plate (earth plate) that have a predetermined physical positional relationship, exhibiting poor freedom of layout. In addition, the characteristics of the inverted F antenna depend on the area size of the ground plate, and decreasing the area leads to deteriorated characteristics. Hence, there has been a problem in that, if the mounting density of components is required to increase so as to reduce the required area of a printed wiring board, then the mounting area of components uses up the area of the printed wiring board, and the area of the ground plate cannot be secured, making it impossible to obtain desired characteristics of the inverted F antenna.

In the case of a ceramic chip antenna, the chip antenna itself has a size that permits surface mounting. To mount the chip antenna, however, a large ground area is required to obtain desired characteristics of the antenna, leading to a problem in that the entire antenna apparatus including a peripheral circuit and the ground will be large. There is another problem of the chip antenna being expensive.

Accordingly, an object of the present invention is to provide an antenna apparatus, a printed wiring board, a printed circuit board, a communication adapter and portable electronic equipment that make it possible to improve the mounting density of an entire circuit and to achieve a smaller printed wiring board while securing the characteristics (sensitivity, in particular) of an antenna.

SUMMARY

To solve the aforesaid problem, an antenna apparatus is characterized by being provided with a ground member having a length, along a predetermined directional axis, of about a quarter or more of the wavelength of an electromagnetic wave used for communication, and an antenna element disposed to extend in a direction substantially orthogonal to the directional axis, and grounded to the ground member.

In this case, the antenna element may be disposed substantially on the same plane along the configuration of an end portion of the ground member with a predetermined distance provided therebetween.

The antenna element may be provided with an antenna element main body and a feeder terminal, and the antenna element main body and the feeder terminal may cooperatively function as a ¼-wavelength inverted F antenna.

Moreover, the ground member may be constructed to serve as a shielding member for shielding an electronic circuit by covering it.

Furthermore, the ground member and the antenna element may be formed as one piece.

A printed wiring board is characterized by comprising a ground member having a length, along a predetermined directional axis, of about a quarter or more of the wavelength of an electromagnetic wave used for communication, and an antenna element disposed to extend in a direction substantially orthogonal to the directional axis and grounded to the ground member, wherein the ground member and the antenna element are made in the form of printed wiring.

In this case, the antenna element may be disposed substantially on the same plane along the configuration of an end portion of the ground member with a predetermined distance provided therebetween.

Furthermore, the antenna element may comprise an antenna element main body and a feeder terminal, and the antenna element main body and the feeder terminal may cooperatively function as a ¼-wavelength inverted F antenna.

In addition, the ground member and the antenna element may be formed as one piece.

A printed circuit board is characterized by comprising a printed wiring board, an electronic circuit disposed on the printed wiring board, a ground member having a length, along a predetermined directional axis, of about a quarter or more of the wavelength of an electromagnetic wave used for communication, and an antenna element disposed to extend in a direction substantially orthogonal to the directional axis, and grounded to the ground member.

In this case, the antenna element may be disposed substantially on the same plane along the configuration of an end portion of the ground member with a predetermined distance provided therebetween.

Furthermore, the antenna element may comprise an antenna element main body and a feeder terminal, and the antenna element main body and the feeder terminal may cooperatively function as a ¼-wavelength inverted F antenna.

Moreover, the antenna element and the ground member may be formed as one piece.

In addition, the antenna element may be formed as printed wiring on the printed wiring board, and the ground member may be a separate component from the printed wiring board.

The ground member may be constructed as a shielding member for shielding the electronic circuit by covering it.

Furthermore, the printed circuit board may be provided with a ground pattern formed on the printed wiring board and electrically connected to the ground member.

The antenna element and the ground member are formed as printed wiring on the printed wiring board.

A communication adapter is characterized by comprising a printed wiring board, an electronic circuit disposed on the printed wiring board, a ground member having a length, along a predetermined directional axis, of about a quarter or more of the wavelength of an electromagnetic wave used for communication, an antenna element disposed to extend in a direction substantially orthogonal to the directional axis, and grounded to the ground member, and a connector connection terminal, wherein the connector connection terminal is disposed on a side toward which an antenna element main body constituting the antenna element extends in relation to the printed wiring board.

In this case, the antenna element may be provided with a feeder terminal, and the antenna element main body and the feeder terminal may cooperatively function as an inverted F antenna.

Portable electronic equipment is characterized by comprising any one of the antenna apparatuses described above.

In this case, the portable electronic equipment may be formed to be a wrist watch type.

DETAILED DESCRIPTION

Preferred embodiments of the present invention will be explained with reference to the accompanying drawings.

First Embodiment

Figure 1:
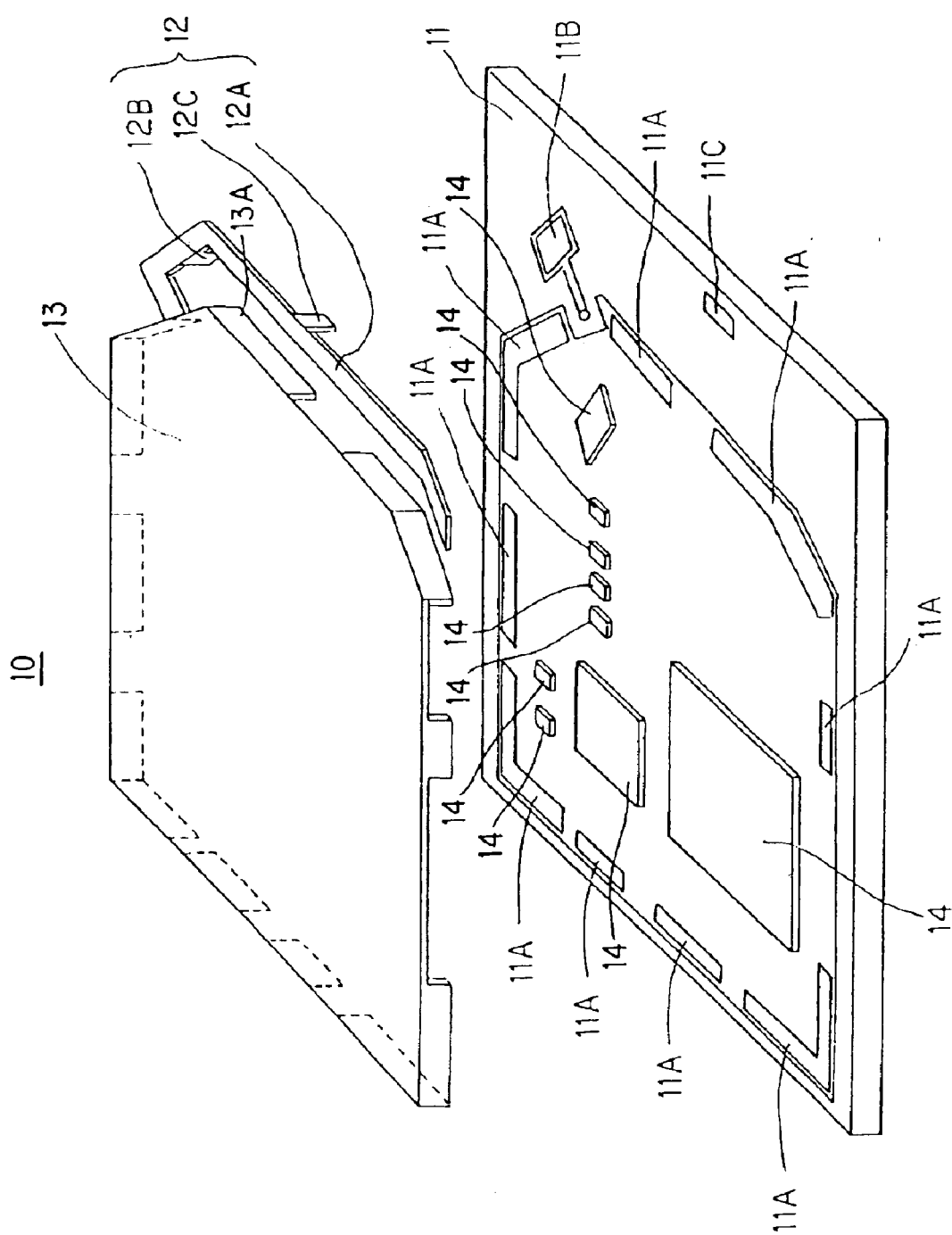
FIG. 1 is an assembly diagram of a printed circuit board according to a first embodiment.
Figure 2:
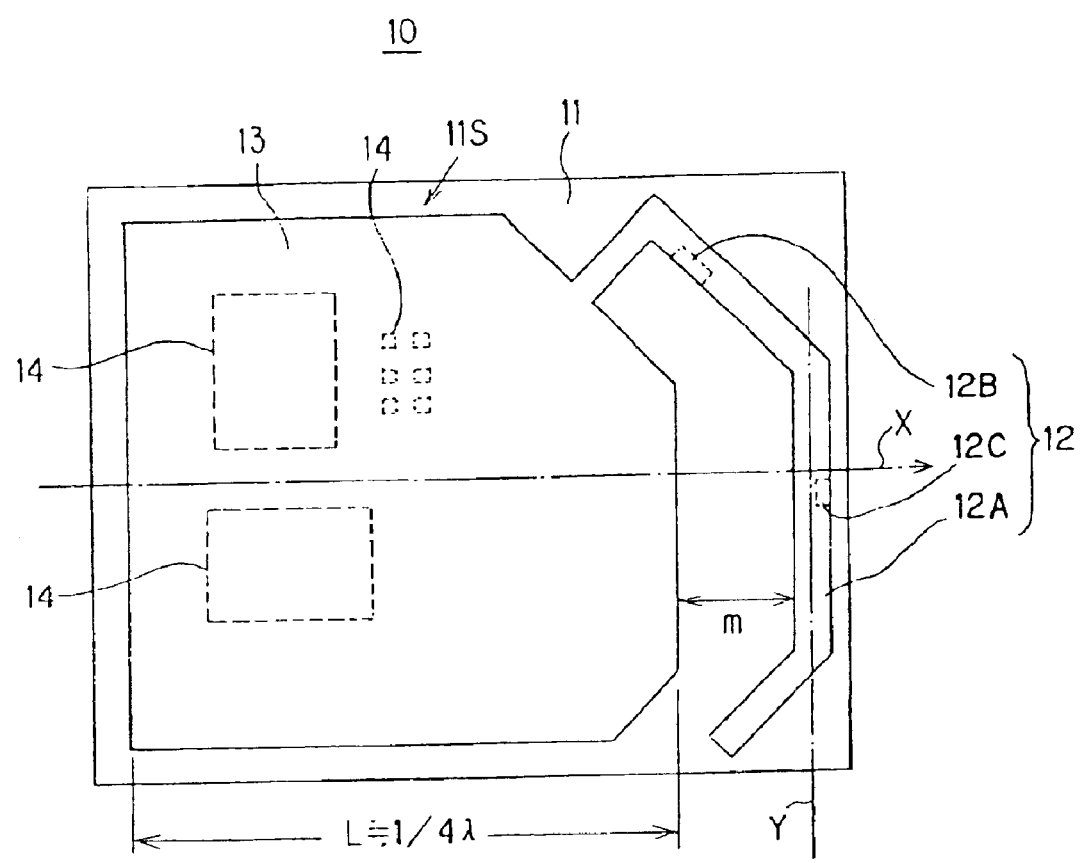
FIG. 2 is a top view of the printed circuit board according to the first embodiment.
Figure 3:
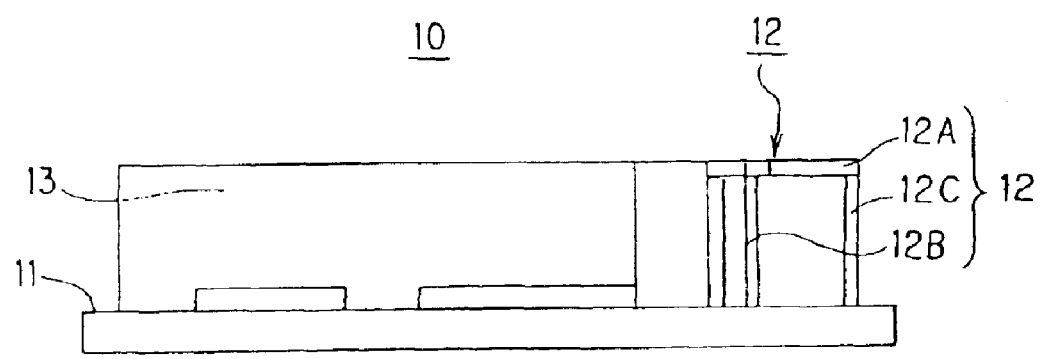
FIG. 3 is a front view of the printed circuit board according to the first embodiment.
Figure 4:
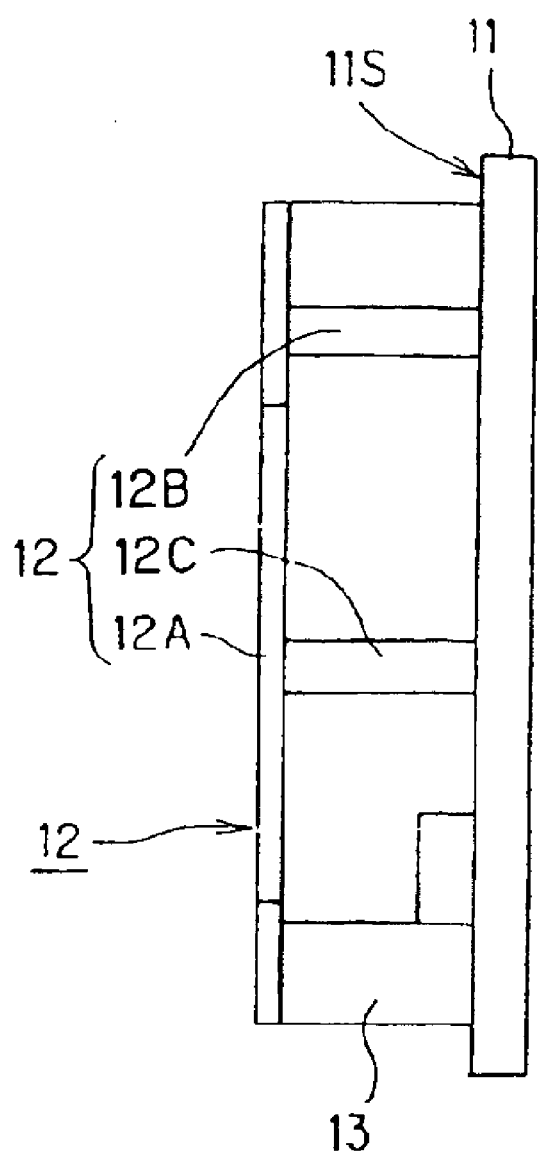
FIG. 4 is a side view of the printed circuit board according to the first embodiment.

FIG. 1 is an assembly diagram of a printed circuit board 10 on which an antenna apparatus in accordance with a first embodiment has been mounted. FIG. 2 is a top view of the printed circuit board 10 in accordance with the first embodiment. FIG. 3 is a front view of the printed circuit board 10 in accordance with the first embodiment. FIG. 4 is a side view of the printed circuit board 10 in accordance with the first embodiment.

Referring to FIG. 1 through FIG. 4, a printed wiring board 11 has circuit components 14 or the like mounted thereon, an electrode pattern for wiring being formed on a surface of the printed wiring board 11 (and inner layers in the case of a multi-layer board). Ground (earth) patterns 11A to which a shielding member 13 is soldered are formed on the top surface of the printed wiring board 11. The shielding member 13 is soldered when the antenna apparatus is mounted. The ground patterns 11A to which the shielding member 13 is soldered are usually formed by removing a solder-proof resist formed on the top surface of the ground pattern of the printed wiring board 11.

As shown in FIG. 1, in the printed circuit board 10 for a high-frequency circuit, the shielding member 13 is normally soldered to the printed wiring board 11 at a plurality of locations. The printed wiring board 11 may be a multi-layer board or a single-layer board.

An antenna element 12 is provided substantially in parallel with the printed wiring board 11. In the case of the first embodiment, a feeder terminal (feeding point) 12B electrically connected to the printed wiring board 11 supports an antenna element main body 12A.

The antenna element 12 is integrally formed with the shielding member 13. The shielding member 13 and antenna element 12 can be obtained at the same time from a single metal plate by devising the shapes of their bent portions and dimensions.

An antenna main body supporting portion 12C has the same length as that of the feeder terminal 12B in the direction perpendicular to the printed wiring board 11, and supports the antenna element 12 on the board when mounted on the board. As a result, the antenna element main body 12A is maintained in parallel with the board and in the same plane as the planar portion of the shielding member 13. Shielding member bent portions 13A also have the same length as the feeder terminal 12B and the antenna main body supporting portion 12C in the direction perpendicular to the printed wiring board 11, and secures and supports the planar portion of the shielding member 13 with respect to the board. In FIG. 1, other shielding member bent portions have also the same length in the direction perpendicular to the printed wiring board 11.

In order to avoid influences on the distribution of current passing through the antenna element 12, the antenna main body supporting portion 12C must be formed perpendicularly to the antenna element main body 12A. In this case, it is preferable not to provide a ground or other types of current passages, including an internal layer in the case of a multi-layer board, under the antenna element 12 of the printed wiring board 11. The antenna element soldering pattern 11C is a pattern for fixing by soldering the distal end portion of the antenna main body supporting portion 12C onto the printed wiring board 11, and is not electrically connected to another wiring.

Meanwhile, the feeder terminal 12B vertically formed on the antenna element main body 12A in the same manner as the antenna main body supporting portion 12C is soldered to a soldering pattern 11B on the printed wiring board 11. The soldering pattern 11B secures the feeder terminal 12B onto the printed wiring board 11 by soldering, one end thereof being electrically connected to a signal feeding point of a circuit formed on the printed wiring board 11. This allows transmission signals and reception signals of a radio circuit, not shown, to be transferred between the antenna and the radio circuit.

The antenna element 12 is preferably made of a material, such as copper, which has high electrical conductivity. Alternatively, however, a material having high electrical conductivity may be used for plating on the surface.

With this arrangement, the antenna element main body 12A and the feeder terminal 12B cooperatively function as an inverted F antenna. The position where the feeder terminal 12B is connected to the antenna element main body 12A is set such that a predetermined value of impedance of the inverted F antenna is obtained. The impedance value is set, for example, 50 Ω.

The shielding member 13 is for electromagnetically shielding the circuit components 14, and it covers circuit components, such as the circuit components 14, and the peripheries of wiring patterns (not shown). The circuit components 14 typically include semiconductor integrated circuits and chip components mainly of 1608 size (outside dimension: 1.6 mm×0.8 mm), 1005 size (outside dimension: 1.0 mm×0.5 mm), and 0603 size (outside dimension: 0.6 mm×0.3 mm).

The shielding member 13 is connected, through the shielding member bent portion 13A, to the ground (earth) pattern 11A formed on the printed wiring board 11.

From the viewpoint of the characteristics of the inverted F antenna, ideally, the area of the ground of the antenna apparatus is large. Preferably, therefore, the ground is actually provided in the surface area of the printed wiring board 11 as largely as possible.

In reality, however, there is an upper limit in the size of the printed wiring board 11 from the point of compactness of the apparatus. Accordingly, the effective area of the ground member will be limited.

In the first embodiment, therefore, the wavelength of an electromagnetic wave used for communication is set as λ and a length L along a predetermined directional axis X of the shielding member 13 functioning as the ground member is set substantially to ¼λ (¼ wavelength) in order to reduce the effective area of the ground member while improving the performance of the antenna apparatus at the same time. A ground member having a length of substantially ¼λ or more may of course be used; however, it is desirable to set the length of the shielding member 13 in the predetermined directional axis X to substantially ¼λ from the viewpoint of an installation area. A central axis Y of a major portion of the antenna element 12 is disposed so as to extend in the direction substantially orthogonal to the directional axis X.

Furthermore, in the first embodiment, the shielding member 13 grounded to electromagnetically shield the circuit components, such as the circuit components 14, and wiring patterns is used as the ground of the antenna element 12. In this case, the effective area of the ground is approximately equal to the area occupied on the printed wiring board 11 of the shielding member 13 shown in FIG. 1.

In other words, regardless of the conditions of the circuit components, including the circuit components 14, and the wiring patterns, it is possible to secure the ground area. This means that a sufficient ground area for obtaining antenna characteristics can be secured even if a sufficiently large ground pattern cannot be formed on the printed wiring board 11.

Figure 5:
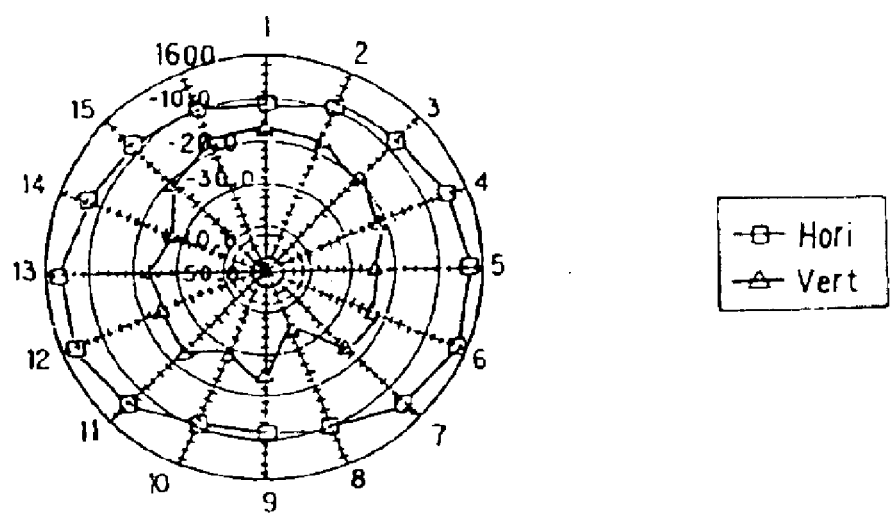
FIG. 5 is an explanatory diagram of the radiation characteristics of an antenna apparatus according to the first embodiment.
Figure 6:
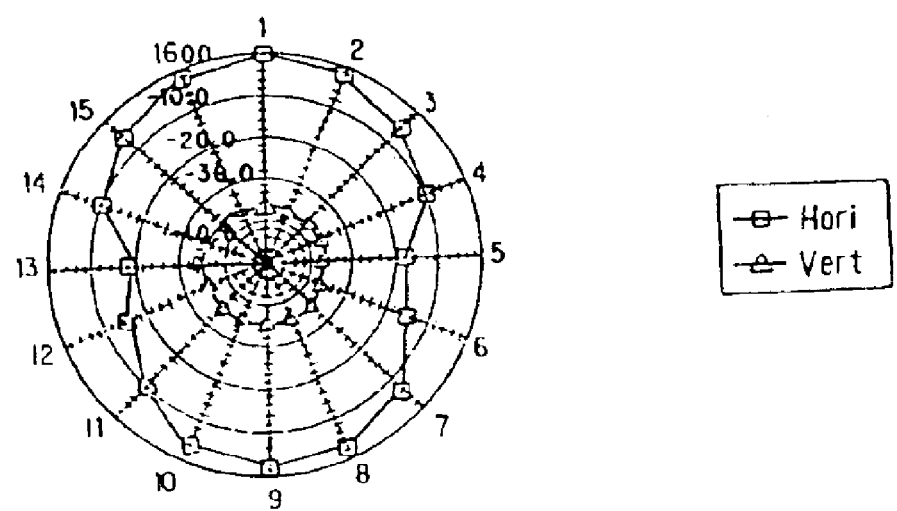
FIG. 6 is an explanatory diagram of the radiation characteristics of a dipole antenna for comparison.
Figure 7:
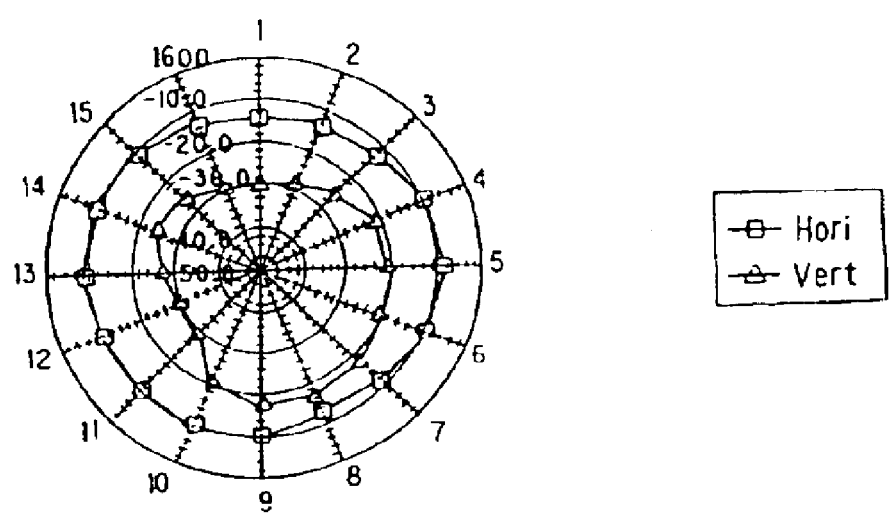
FIG. 7 is an explanatory diagram of a radiation characteristic of an antenna apparatus in which the length of a shielding member, which functions as a ground member, for comparison in a predetermined directional axis X is set to substantially below ¼λ.

FIG. 5 is a radiation characteristic diagram of the antenna apparatus according to the first embodiment. FIG. 6 is a radiation characteristic diagram of a dipole antenna for a comparison purpose. Furthermore, FIG. 7 is a radiation characteristic diagram of an antenna apparatus in which the length in the predetermined directional axis X of the shielding member 13 functioning as a ground member for a comparison purpose is set to a value substantially below ¼λ.

Referring to FIG. 5 and FIG. 6, numerals 1 through 16 disposed in the outer peripheral portion denote the directions obtained by equally dividing the full circle 360 degrees by 16, and the actual angular interval denoted by two adjoining numerals is 22.5 degrees. Numerical values (dB values) in the figures indicate dipole antenna ratios (dBd). "Hori" denotes a horizontal characteristic, while "Vert" denotes a vertical characteristic.

As shown in FIG. 5, although the directivity characteristic is different from the dipole antenna by 90°, the radiation characteristic exhibits deterioration equal to or within a few dB, as compared with those of the dipole antenna shown in FIG. 6, indicating that the antenna apparatus according to the first embodiment has permitted extremely outstanding radiation characteristics to be achieved.

In contrast to the above, it is seen that the performance of the antenna apparatus deteriorates when the length of the shielding member 13 functioning as the ground member along the predetermined directional axis X is set to a value below the substantially ¼λ. Referring to FIG. 7, the radiation characteristic deteriorates 10 dB or more, as compared with that of the dipole antenna shown in FIG. 5, indicating that the performance of the antenna apparatus has deteriorated.

Second Embodiment

The antenna element and the shielding member have been formed as one piece in the above first embodiment, while the antenna element and the shielding member are separate parts in a second embodiment.

Figure 8:
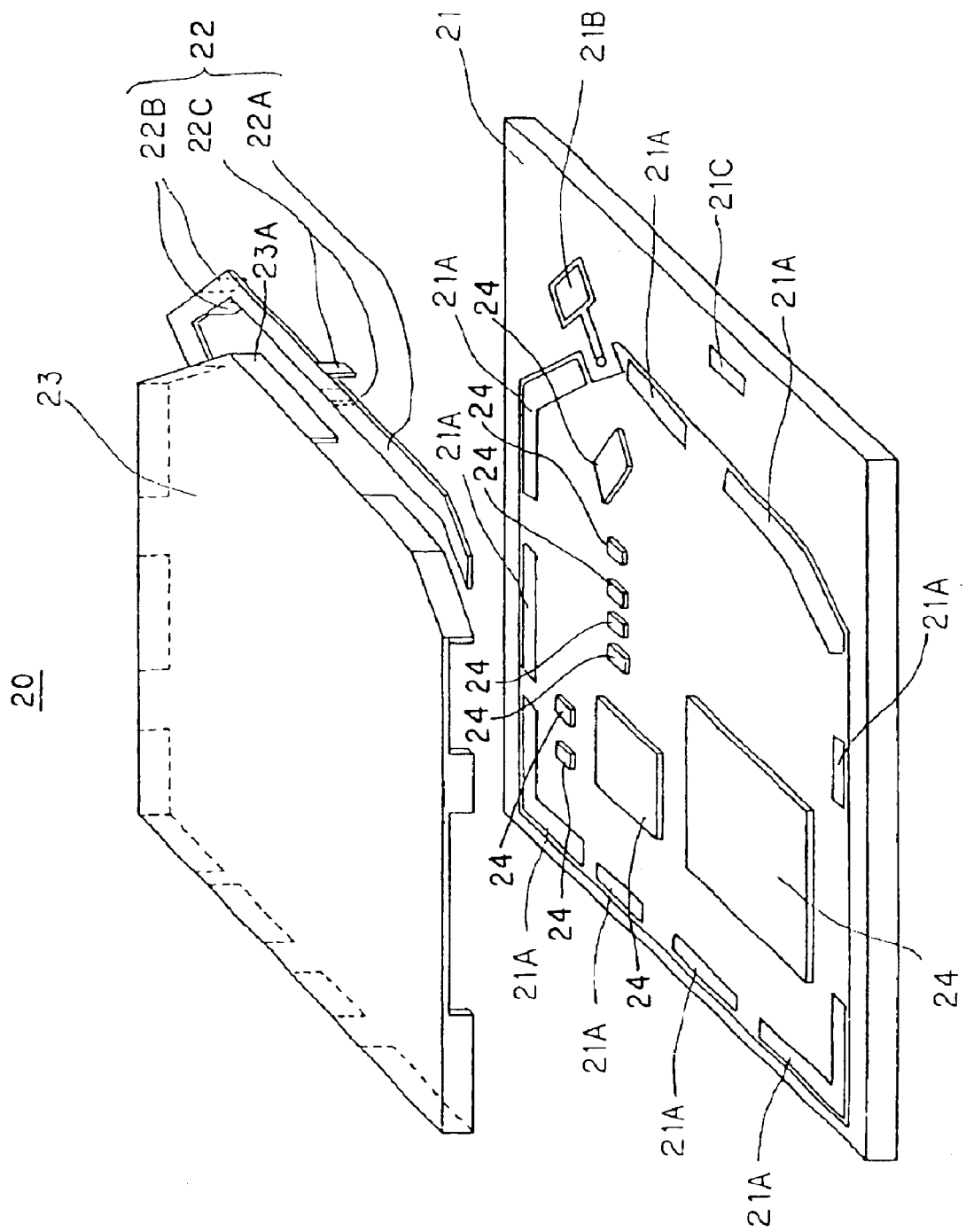
FIG. 8 is an assembly diagram of a printed circuit board according to a second embodiment.
Figure 9:
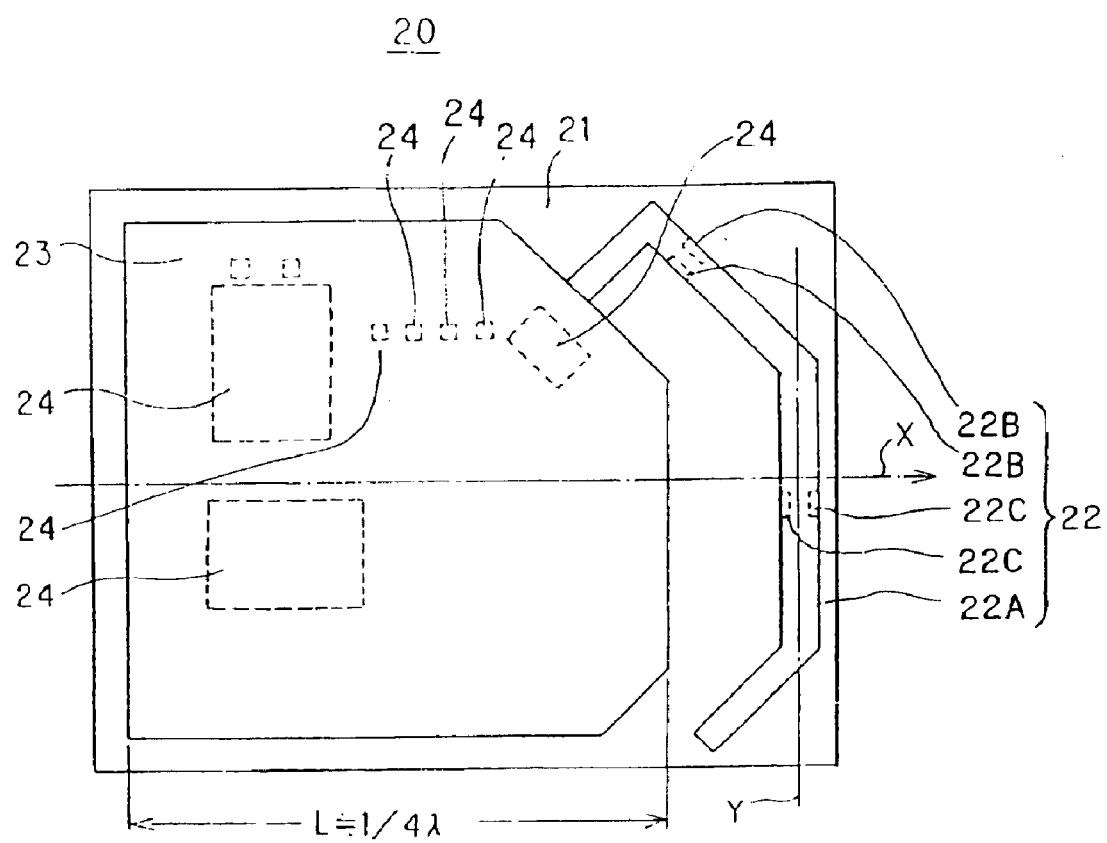
FIG. 9 is a top view of the printed circuit board according to the second embodiment.
Figure 10:
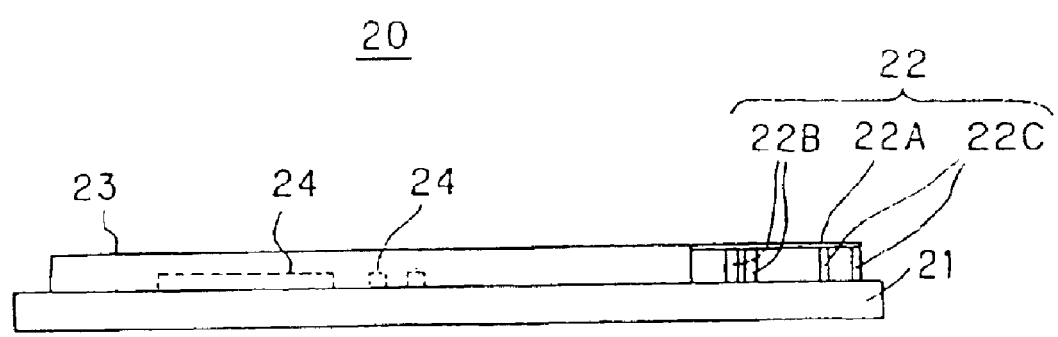
FIG. 10 is a front view of the printed circuit board according to the second embodiment.

FIG. 8 is an assembly diagram of a printed circuit board on which an antenna apparatus in accordance with the second embodiment has been mounted. FIG. 9 is a top view of the printed circuit board in accordance with the second embodiment. FIG. 10 is a front view of the printed circuit board in accordance with the second embodiment.

Referring to FIG. 8 through FIG. 10, primary components disposed on the top surface of a printed wiring board 21 constituting a printed circuit board 20 are an antenna element 22, a shielding member 23 and circuit components 24.

In this case also, the printed wiring board 21 may be formed of a single-layer substrate or a multi-layer substrate, as in the case of the first embodiment.

The antenna element 22 is provided substantially in parallel with the printed wiring board 21 in a three-dimensional fashion. In the case of the second embodiment, a feeder terminal (feeding point) 22B is connected by soldering to the printed wiring board 21 in a soldering pattern 21B, and an antenna main body supporting portion 22C is soldered in a soldering pattern 21C. The element soldering pattern 21C is a pattern for securing by soldering the distal end portion of the antenna main body supporting portion 22C onto the board, and it is not electrically connected with other wiring.

As a result, an antenna element main body 22A is supported by the feeder terminal 22B and the antenna main body supporting portion 22C. The antenna can be positionally secured by providing a plurality of the antenna main body supporting portions 22C on both sides of the element, as shown in the figures. One end point of the antenna element 22 is electrically and mechanically connected to the shielding member 23 by soldering, brazing or the like.

As in the case of the first embodiment, the antenna element 22 is preferably formed of a material, such as copper, that has high electrical conductivity. Alternatively, however, a material having high electrical conductivity may be used for surface plating.

With the arrangement described above, the antenna element main body 22A, the feeder terminals 22B and the antenna main body supporting portions 22C cooperatively function as an inverted F antenna. The feeder terminal 22B is connected to the antenna element main body 22A, which has ¼λ length of the inverted F antenna, at a point wherein the impedance of the antenna becomes a predetermined value (e.g., 50 Ω).

The shielding member 23 is for electromagnetically shielding the circuit components 24, and it covers circuit components, such as the circuit components 24, and the peripheries of wiring patterns.

The shielding member 23 is further connected, through a shielding member bent portion 23A, to a ground (earth) pattern 21A formed on the printed wiring board 21 in the same manner as in the first embodiment described above.

In the second embodiment also, as in the first embodiment, the wavelength of an electromagnetic wave used for communication is set as λ and a length L of the shielding member 23 functioning as the ground member along a predetermined directional axis X is set substantially to ¼λ (¼ wavelength) in order to reduce the effective area of the ground member while improving the performance of the antenna apparatus at the same time. A ground member having a length of substantially ¼λ or more may of course be used; however, it is desirable to set the length of the shielding member 23 in the predetermined directional axis X to substantially ¼λ from the viewpoint of an installation area. A central axis Y of a major portion of the antenna element 22 is disposed so as to extend in the direction substantially orthogonal to the directional axis X.

As a result, the second embodiment also allows the area of a printed circuit board to be reduced while improving the characteristics of the antenna apparatus at the same time.

Furthermore, the shielding member 23 grounded to electromagnetically shield the circuit components, such as the circuit components 24, and wiring patterns is used as the ground of the antenna element 22. Thus, regardless of the layout conditions of the circuit components, including the circuit components 24, and the wiring patterns (not shown), it is possible to secure the ground area. Even if an adequate ground pattern cannot be formed on the printed wiring board 21, an ample ground area can be secured.

Moreover, according to the second embodiment, the antenna element 22 and the shielding member 23 are formed in discrete components. This requires an additional step for combining the antenna element 22 and the shielding member 23, while the two components can be separately machined, permitting easier machining. In addition, the arrangement permits easier adaptation to a variety of product types.

Third Embodiment

In the foregoing embodiments, the antenna element has been separate from the printed wiring board. In a third embodiment, the antenna element is provided in the form of a printed antenna (wiring pattern) on the printed wiring board.

Figure 11:
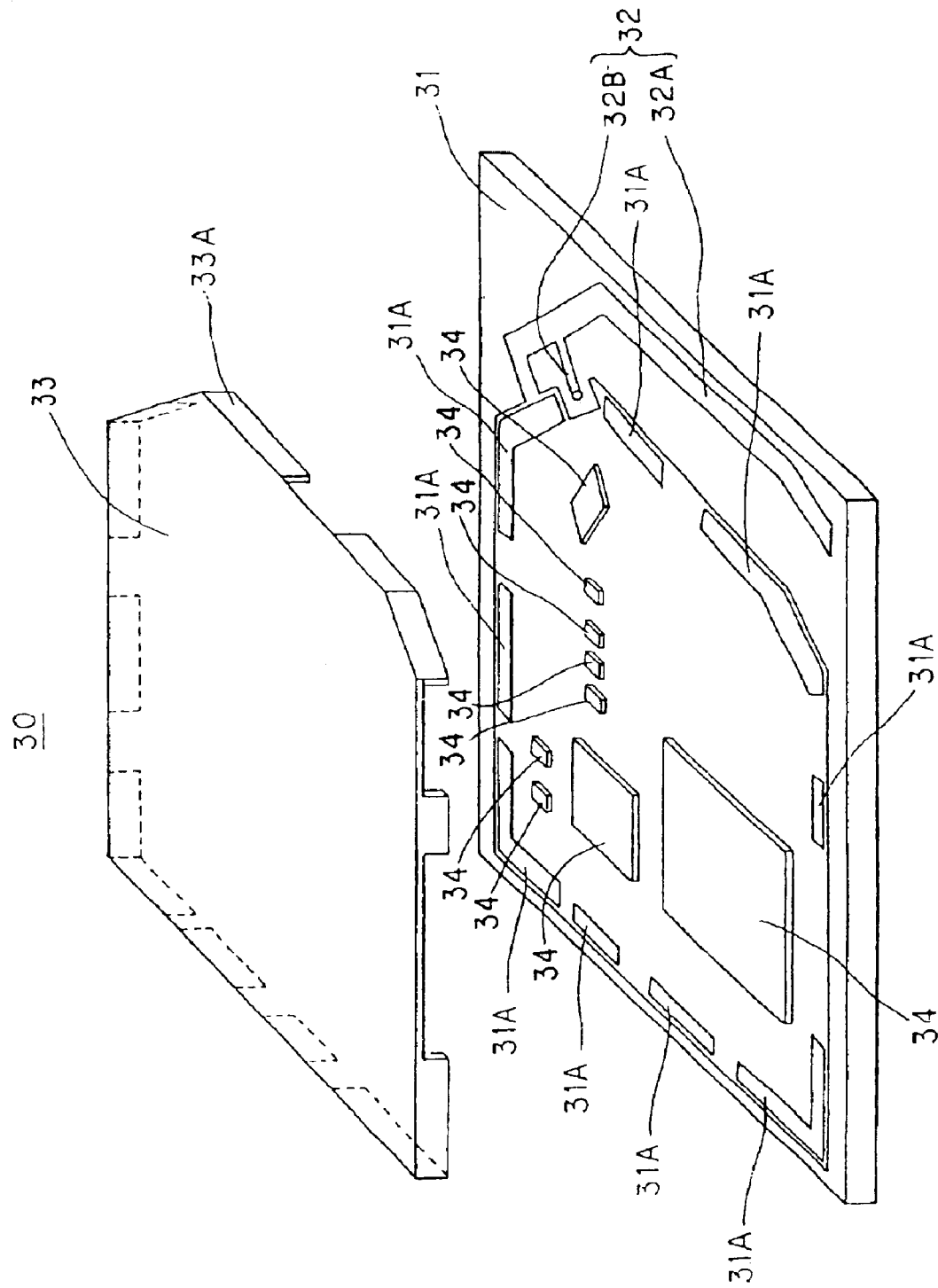
FIG. 11 is an assembly diagram of a printed circuit board according to a third embodiment.
Figure 12:
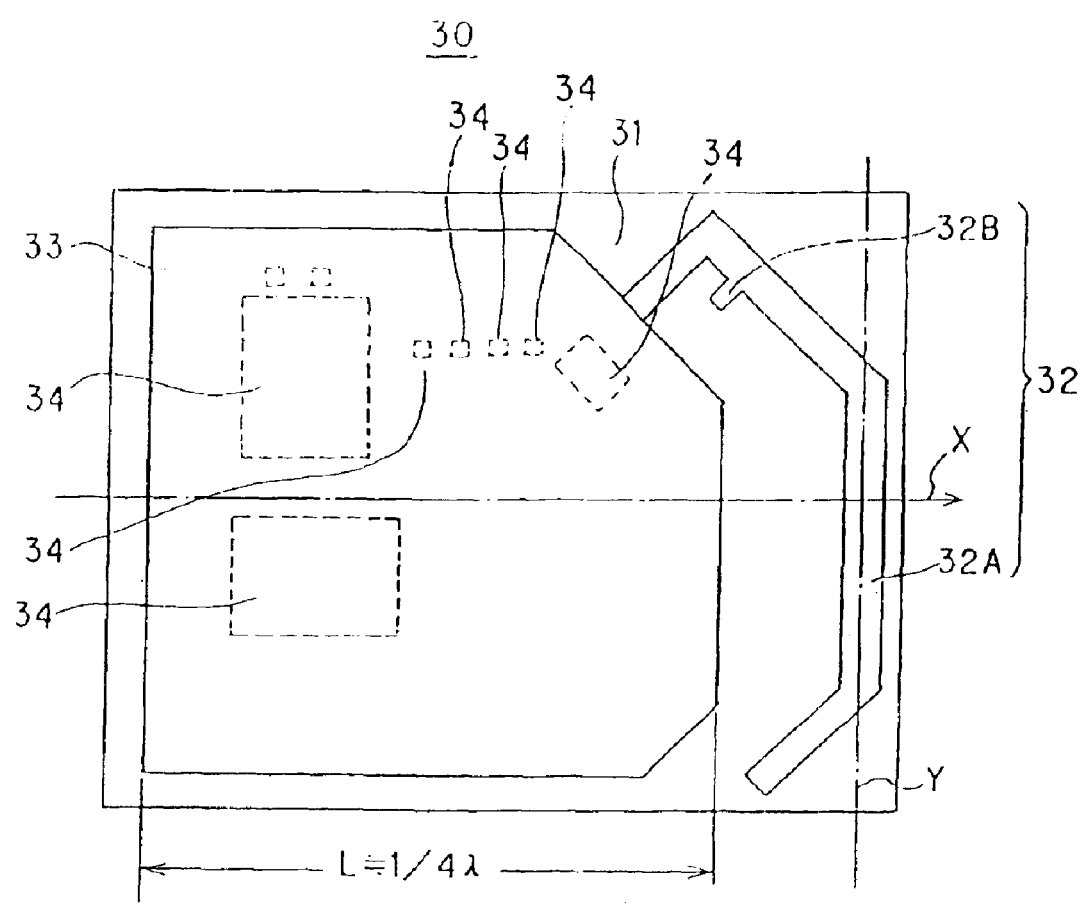
FIG. 12 is a top view of the printed circuit board according to the third embodiment.
Figure 13:
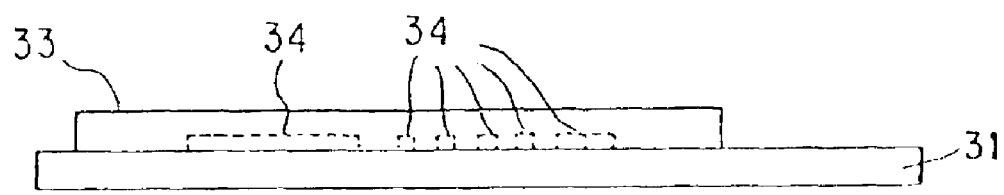
FIG. 13 is a front view of the printed circuit board according to the third embodiment.

FIG. 11 is an assembly diagram of a printed circuit board on which an antenna apparatus in accordance with the third embodiment has been mounted. FIG. 12 is a top view of the printed circuit board in accordance with the third embodiment. FIG. 13 is a front view of the printed circuit board in accordance with the third embodiment.

Referring to FIG. 11, primary components disposed on the top surface of a printed wiring board 31 constituting a printed circuit board 30 are an antenna element main body 32A disposed by being formed as a wiring pattern, a shielding member 33 and circuit components, such as circuit components 34, and wiring pattern (not shown).

In this case also, the printed wiring board 31 may be formed of a single-layer substrate or a multi-layer substrate, as in the case of the foregoing embodiments.

The antenna element main body 32A is provided in the form of printed wiring on the printed wiring board 31. A feeder terminal (feeding point) 32B is electrically connected to power supply wiring on the printed wiring board 31, and one end of the antenna element main body 32A is connected to a ground pattern 31A formed on the printed wiring board 31. In this case, the patterns may be continuously formed to be the same ground pattern.

The portion of the ground pattern 31A formed on the printed wiring board 31 that faces the antenna element main body 32A is formed with a predetermined interval substantially in parallel with the antenna element main body 32A. The portion of the antenna element main body 32A that is connected to the ground pattern 31A is connected perpendicularly to the ground pattern.

With the arrangement described above, the antenna element main body 32A and the feeder terminals 32B cooperatively function as an inverted F antenna. The position where the feeder terminal 32B is connected to an antenna element 32 is set such that a predetermined value of impedance (e.g., 50 Ω) of the inverted F antenna is obtained.

A shielding member 33 is for electromagnetically shielding circuit components, such as the circuit components 34, and wiring patterns and it covers circuit components, such as the circuit components 34, and the peripheries of the wiring patterns (not shown).

The shielding member 33 is connected, through a shielding member bent portion 33A, to a ground (earth) pattern 31A formed on the printed wiring board 31 in the same manner as in the first embodiment described above.

In the third embodiment also, as in the embodiments described above, the wavelength of an electromagnetic wave used for communication is set as $\lambda$ and a length L along a predetermined directional axis X of the shielding member 33 functioning as the ground member is set substantially to $\frac{1}{4}\lambda$ ($\frac{1}{4}$ wavelength) in order to reduce the effective area of the ground member while improving the performance of the antenna apparatus at the same time. A ground member having a length of substantially $\frac{1}{4}\lambda$ or more may of course be used; however, it is desirable to set the length of the shielding member 33 in the predetermined directional axis X to substantially $\frac{1}{4}\lambda$ from the viewpoint of an installation area. A central axis Y of a major portion of the antenna element main body 32A is disposed so as to extend in the direction substantially orthogonal to the directional axis X.

Furthermore, as in the case of the foregoing embodiments, the shielding member 33 grounded to electromagnetically shield the circuit components, such as the circuit components 34, and wiring patterns is used as the ground of the antenna element 32. Thus, regardless of the layout conditions of the circuit components, including the circuit components 34, and the wiring patterns, it is possible to secure the ground area. Even if a ground pattern of an ample area cannot be formed on the printed wiring board 31, an ample ground area can be secured.

Moreover, according to the third embodiment, since the antenna element 32 can be provided as the printed wiring when fabricating the printed wiring board, the manufacturing process can be simplified.

Fourth Embodiment

In the third embodiment, the antenna element has been formed as the printed antenna (wiring pattern) on the printed wiring board. In a fourth embodiment, a ground member is formed as a ground pattern on a printed wiring board.

Figure 14:
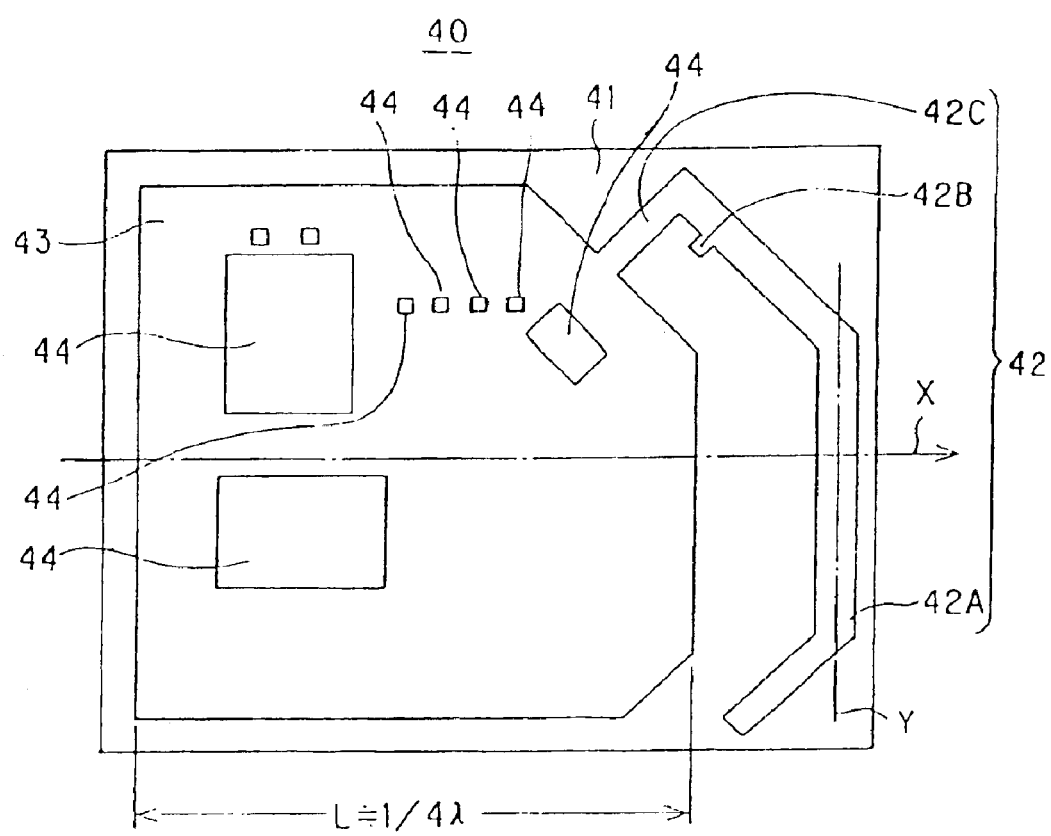
FIG. 14 is a top view of the printed circuit board according to a fourth embodiment.
Figure 15:
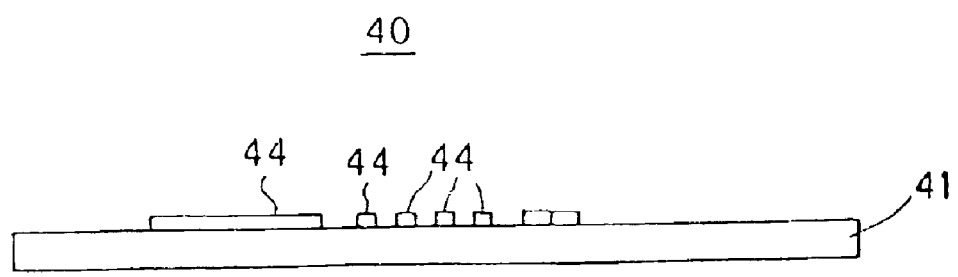
FIG. 15 is a front view of the printed circuit board according to the fourth embodiment.

FIG. 14 is a top view of a printed circuit board on which an antenna apparatus in accordance with the fourth embodiment has been mounted. FIG. 15 is a front view of the printed circuit board shown in FIG. 14.

Referring to FIG. 14 and FIG. 15, primary components disposed on the top surface of a printed wiring board 41 constituting a printed circuit board 40 are an antenna element 42, a ground pattern 43 disposed by being formed as a wiring pattern, and circuit components 44.

In this case also, the printed wiring board 41 may be formed of a single-layer substrate or a multi-layer substrate, as in the case of the foregoing embodiments. Furthermore, in the case of a multi-layer substrate, the ground pattern 43 may be formed on an inner layer, as necessary.

An antenna element main body 42A is provided in the form of the printed wiring on the printed wiring board 41. A feeder terminal (feeding point) 42B is electrically connected to power supply wiring, not shown, on the printed wiring board 41, while a grounding terminal (grounding point) 42C is electrically connected to the ground pattern 43.

In this case, the performance of an antenna element main body 42A can be improved by plating the surface of the printed wiring with a material having high electrical conductivity.

With the arrangement described above, the antenna element main body 42A, the feeder terminals 42B and the grounding terminal 42C cooperatively function as an inverted F antenna. The position where the feeder terminal 42B is connected to the antenna element main body 42A is set such that a predetermined value of impedance (e.g., 50 Ω) of the inverted F antenna is obtained.

In general, the ground pattern 43 is appropriately disposed around the circuit components 44.

In this case, preferably, the ground pattern is continuously provided as much as possible along a predetermined directional X axis. For such a purpose, use of a multi-layer substrate permits easier formation of the ground.

In the fourth embodiment also, as in the embodiments described above, the wavelength of an electromagnetic wave used for communication is set as $\lambda$ and a length L along a predetermined directional axis X of the ground pattern 43 functioning as the ground member is set substantially to $\frac{1}{4}\lambda$ ($\frac{1}{4}$ wavelength) in order to reduce the effective area of the ground member while improving the performance of the antenna apparatus at the same time. A ground member having a length of substantially $\frac{1}{4}\lambda$ or more may of course be used; however, it is desirable to set the length of the ground pattern 43 in the predetermined directional axis X to substantially $\frac{1}{4}\lambda$ from the viewpoint of an installation area. A central axis Y of a major portion of the antenna element 42 is disposed so as to extend in the direction substantially orthogonal to the directional axis X.

Moreover, according to the fourth embodiment, since the antenna element 42 and the ground pattern 43 can be provided as the printed wiring when fabricating the printed wiring board, the manufacturing process can be simplified.

MODIFICATION EXAMPLES OF THE 1st THROUGH 4th EMBODIMENTS

First Modification Example

In the above explanation, the shielding member has covered the circuit components over the entire printed wiring board except for the portion where the antenna element is disposed. If, however, there is an allowance on a printed wiring board, it is possible to form the ground pattern electrically connected to the shielding member on the printed wiring board so as to secure the ground area by the shielding member and the ground pattern.

Second Modification Example

In the above explanation, the antenna element has a bent configuration to fit along the shielding member. The antenna element, however, may alternatively have a curved configuration or other configurations as long as it follows the configuration of the shielding member, i.e., it has a configuration parallel with the end portion of the shielding member. In this case, it will be further effective if the microscopic current direction of the current passing through the antenna element is regarded as a vector, and the positions of the components around an antenna element pattern, a wiring pattern or a pad are set so that the foregoing vector is not parallel with the vector (microscopic current direction) of the current passing through the component, the wiring pattern or the pad as much as possible.

Third Modification Example

The above description has been given of the antenna apparatus and the printed circuit board provided with the antenna apparatus. It is possible for a printed wiring board to provide the same advantages if it is provided with a ground member wherein a wavelength of an electromagnetic wave used for communication is set as λ and a length along a predetermined directional axis is set substantially to ¼λ (or more) and an antenna element disposed to extend in a direction substantially orthogonal to the directional axis and grounded to the ground member, the ground member and the antenna element being formed as printed wiring.

Fourth Modification Example

In the above description, the mechanical dimensions of the antenna element have not been explained in detail. Basically, the antenna element is preferably formed so as to provide a ¼ wavelength at a desired frequency.

Other Embodiments

A description will now be given of fifth through seventh embodiments in which the printed circuit boards (antenna apparatuses and printed wiring boards) described in the foregoing first through fourth embodiments and the modification examples are used to constitute complete electronic equipment.

Fifth Embodiment

Figure 16:
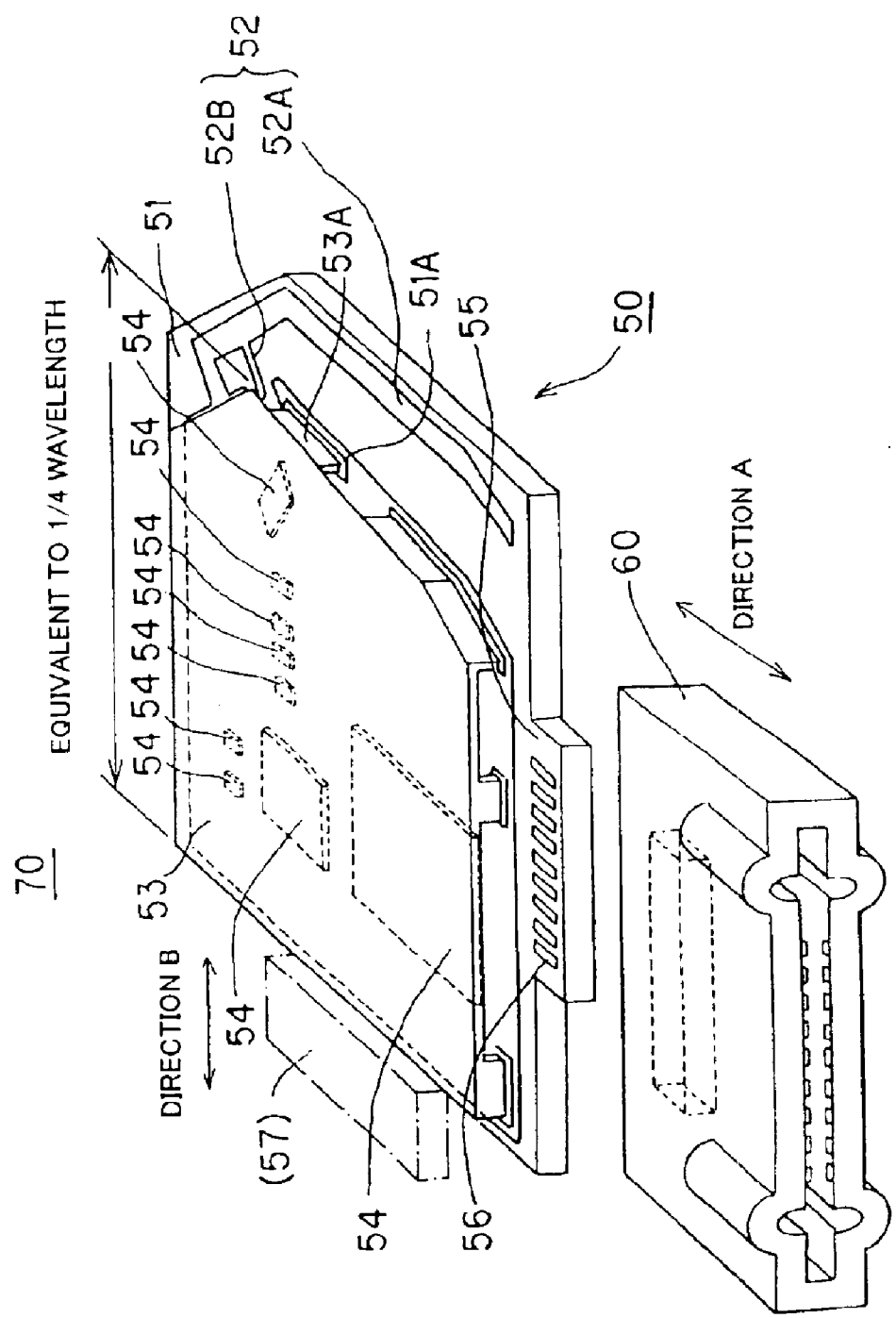
FIG. 16 is an explanatory diagram of a communication adapter module used by being connected to a portable telephone terminal.

FIG. 16 is an explanatory diagram of a communication adapter module 70 used by being connected to a portable telephone terminal.

As shown in FIG. 16, primary components disposed on the top surface of a printed wiring board 51 constituting a printed circuit board 50 are an antenna element 52 disposed by being formed as a wiring pattern, a shielding member 53 and circuit components, such as circuit components 54, and wiring pattern (not shown).

In this case also, the printed wiring board 51 may be formed of a single-layer substrate or a multi-layer substrate, as in the case of the foregoing embodiments.

An antenna element main body 52A is provided in the form of the printed wiring on the printed wiring board 51. A feeder terminal (feeding point) 52B is electrically connected to power supply wiring on the printed wiring board 51. One end of the antenna element main body 52A is connected to a ground pattern 51A formed on the printed wiring board 51. In this case, the patterns may be formed to be continuous into the same ground pattern.

The portion of the ground pattern 51A formed on the printed wiring board 51 that faces the antenna element main body 52A is formed with a predetermined interval substantially in parallel with the antenna element main body 52A. The portion of the antenna element main body 52A that is connected to the ground pattern 51A is connected perpendicularly to the ground pattern 51A.

With the arrangement described above, the antenna element main body 52A and the feeder terminals 52B cooperatively function as an inverted F antenna. The position where the feeder terminal 52B is connected to the antenna element main body 52A is set such that a predetermined value of impedance (e.g., 50 Ω) of the inverted F antenna is obtained.

The shielding member 53 is for electromagnetically shielding circuit components, such as the circuit components 54, and wiring patterns (not shown) and it covers circuit components, such as the circuit components 54, and the peripheries of the wiring patterns.

The shielding member 53 is connected, through a shielding member bent portion 53A, to a ground (earth) pattern 51A formed on the printed wiring board 51 in the same manner as in the third embodiment described above.

One end of the printed wiring board 51 is provided with a connector connecting terminal block 55.

In this case, the connector connecting terminal block 55 is provided on one side substantially parallel with the direction (direction B: the direction in which the antenna element 52 on the printed wiring board 51 and the shielding member 53 are connected) substantially orthogonal to the direction (direction A in the drawing) in which the antenna element main body 52A extends. A plurality of connector connecting terminals (electrode pattern) 56 are formed on the connector connecting terminal block 55.

Connecting terminals (not shown) of a connector 60 are attached to the connector connecting terminals 56. Connecting terminals are, for example, ground terminals, power source terminals and a plurality of signal line terminals for connecting portable telephone terminals and communication adapters.

As described above, the connector connecting terminal block 55 provided on one side substantially in parallel with direction B maintains the relationship between the ground length (equivalent to ¼ wavelength) of an antenna and the antenna element when the apparatus is connected to a portable telephone terminal, thus preventing antenna gain from being degraded.

This is because, if the connector connecting terminal block 55 were provided on one side substantially parallel with direction A, more specifically, if a connecting terminal block denoted by reference numeral 57 were provided, then the ground terminal of a communication adapter would be connected through the intermediary of the ground terminal of a portable telephone and the connector connecting terminals. This would cause a ground pattern to be extended longer than the ¼ wavelength, so that the antenna gain characteristic can be no longer be maintained. In this case, if it were possible to provide a ground pattern having a width approximately the same with that of the printed circuit board 50 in direction B, then gain deterioration in the antenna apparatus constructed of grounds and an antenna element would seem to be restrained. An actual structure, however, would have extremely thin wire rods connecting grounds through connector connecting terminals, so that the structure would be linearly longer only in direction B, possibly resulting in deterioration in predetermined characteristics.

Figure 17:
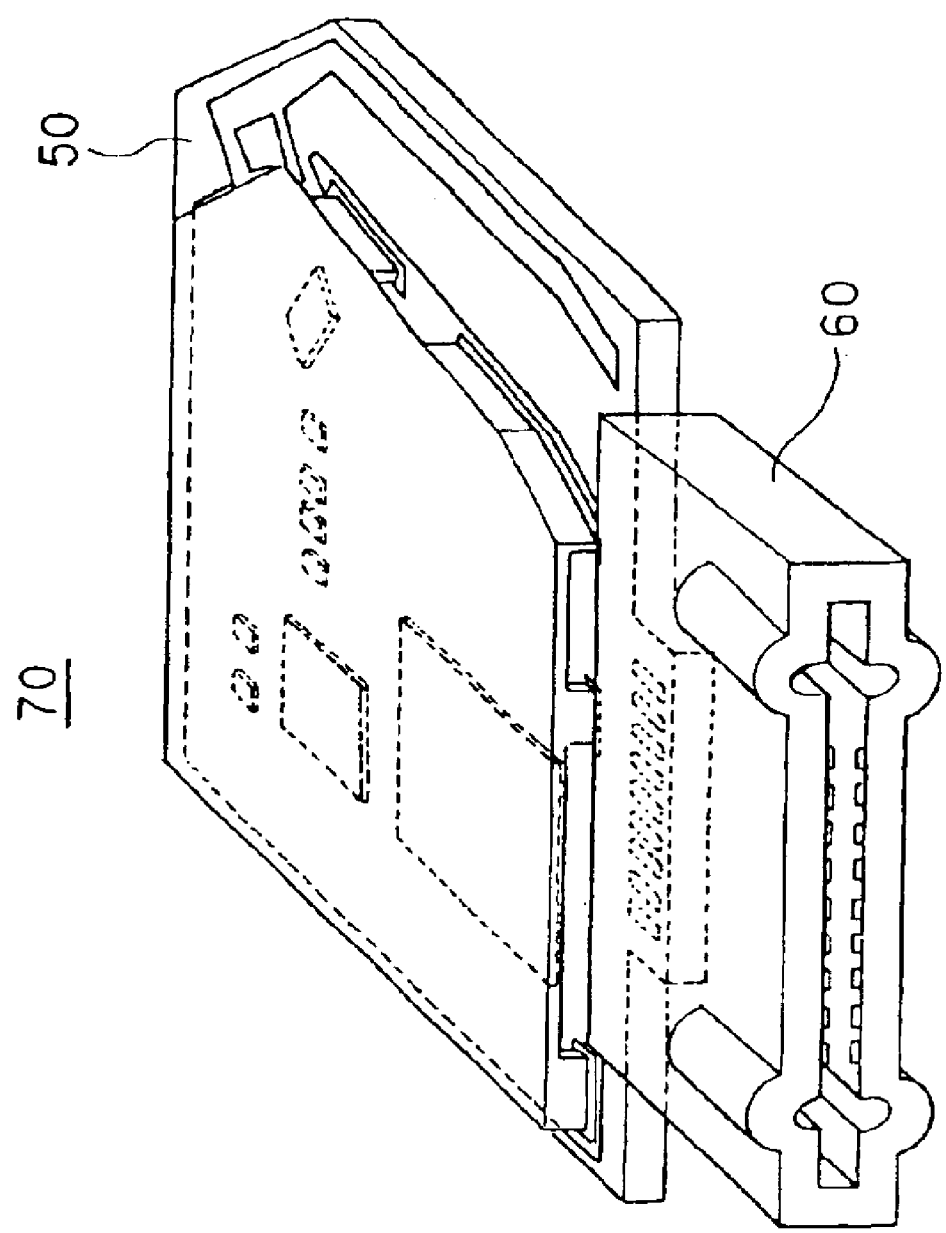
FIG. 17 is an external perspective view of the communication adapter module connected by inserting a connector into a printed circuit board.

FIG. 17 is an external perspective view of a communication adapter module 70 connected by inserting a connector 60 shown in FIG. 16 into the printer circuit board 50.

Figure 18:
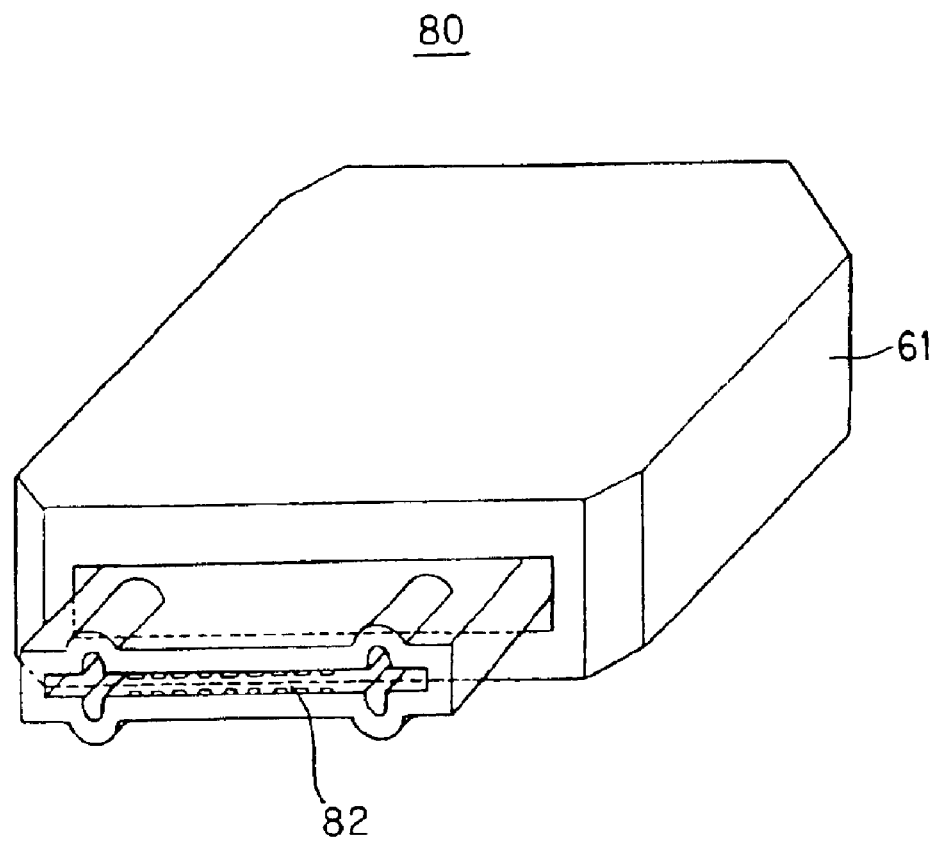
FIG. 18 is an external perspective view of a communication adapter (finished product).

A battery, a case 61, etc. are added and installed to the communication adapter module 70 to complete a communication adapter 80 (finished product), as shown in FIG. 18.

Figure 19:
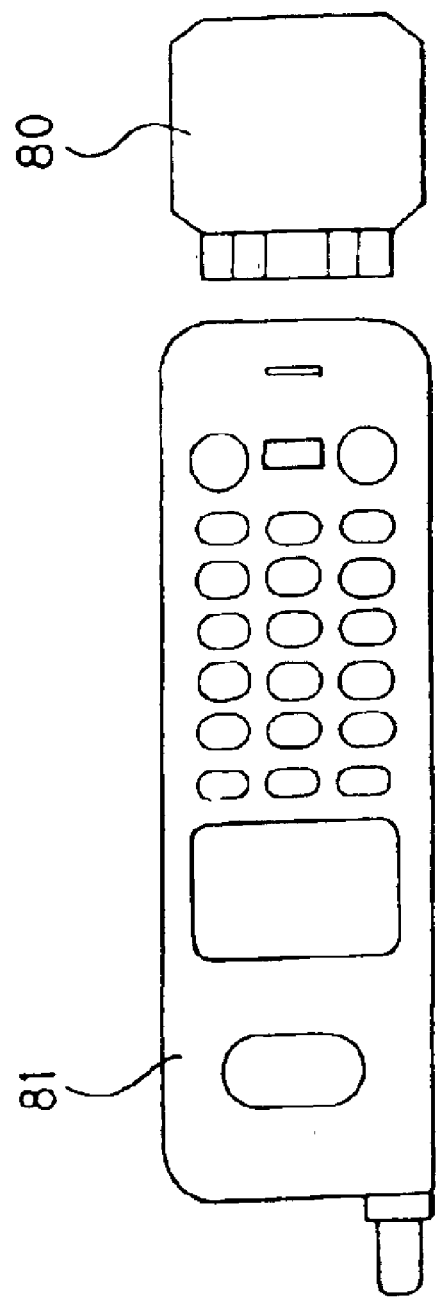
FIG. 19 is a layout explanatory diagram illustrating the communication adapter used by being connected to a portable telephone terminal.

FIG. 19 is a layout explanatory diagram showing the communication adapter 80 used by being connected to a portable telephone terminal 81.

The bottom portion of the portable telephone terminal 81 (a connector terminal (not shown) for external connection provided on the right surface in the drawing) and a connector terminal 82 (refer to FIG. 18) of the communication adapter 80 are inserted and fitted to each other to establish electrical connection.

In this case, as previously mentioned, according to the present embodiment, the connection to the portable telephone terminal 81 will not deteriorate the antenna characteristics of the communication adapter 80.

Figure 20:
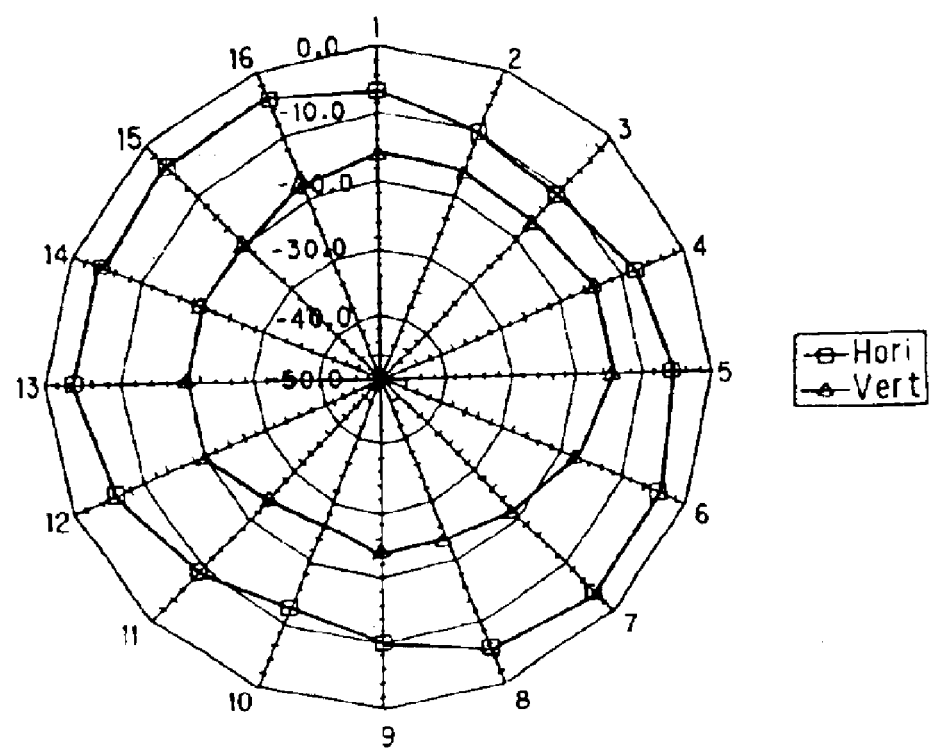
FIG. 20 is an antenna directivity characteristic diagram of a discrete communication adapter not connected to the portable telephone terminal.
Figure 21:
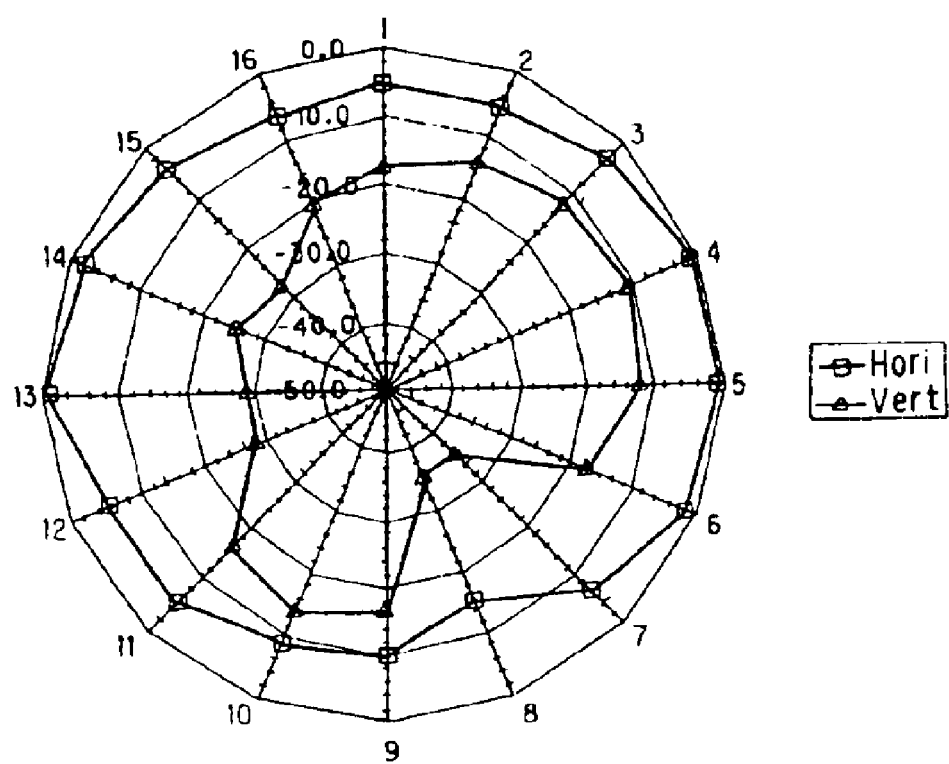
FIG. 21 is a radiation directivity characteristic diagram of an antenna apparatus obtained by connecting the communication adapter and the portable telephone terminal.

FIG. 20 is an antenna directivity characteristic diagram of the communication adapter 80 alone without the portable telephone terminal 81 connected thereto. FIG. 21 is a radiation directivity characteristic diagram of an antenna apparatus obtained by connecting the communication adapter 80 and the portable telephone terminal 81.

Referring to FIG. 20 and FIG. 21, the numerals 1 through 16 disposed in the outer peripheral portion in the drawings denote the directions obtained by equally dividing the full circle 360 degrees by 16, the actual angular interval denoted by the numerals is 22.5 degrees. Numerical values (dB values) in the graphs indicate dipole antenna ratios (dBd).

The antenna directivity characteristic of the discrete communication adapter 80 is good, as shown in FIG. 20.

Meanwhile, the antenna directivity characteristic observed when the communication adapter 80 and the portable telephone terminal 81 are connected does not exhibit characteristic deterioration; rather, it can be seen that the gain improves, as shown in FIG. 21.

The communication adapter 80 described above is connected to the portable telephone terminal 81 and used in combination with another radio terminal apparatus by a predetermined radio communication technology. More specifically, the communication adapter 80 is used in combination with a head set, a hands-free set or the like serving as another radio terminal apparatus by using the Bluetooth, weak radio, etc. as a radio communication technology, and used for a hands-free unit of a portable telephone in a car.

The communication adapter 80 can be also used as a short-distance radio communication system indoors, outdoors or the like, thus permitting information communication with another radio communication equipment.

In other words, the antenna directivity characteristic exhibited when used in combination with a portable telephone terminal is more important than the characteristics of the antenna alone. The construction of the present embodiment is extremely effective for such an application.

Sixth Embodiment

Figure 22:
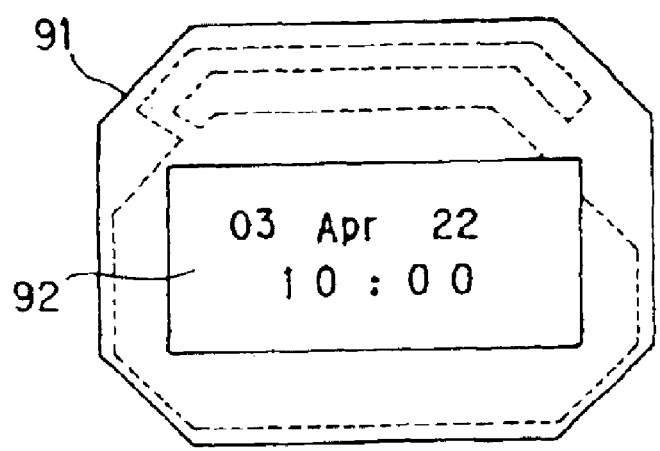
FIG. 22 is a configuration diagram of a wristwatch type (watch type) radio apparatus.
Figure 22:
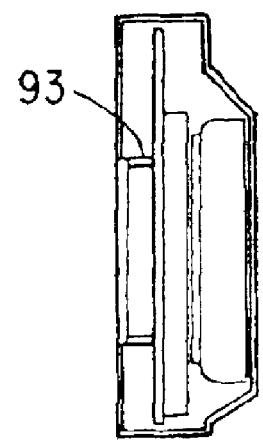
Figure 22:
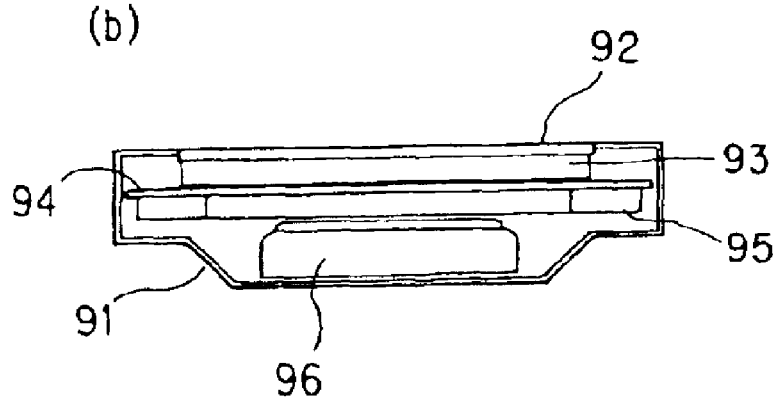

FIG. 22 shows the configuration of a wristwatch type (watch type) wireless apparatus 90 using the printed circuit board described in the foregoing first through fourth embodiments and the modification examples.

FIG. 22(a) is a top view, FIG. 22(b) is a front sectional view and FIG. 22(c) is a side sectional view.

As shown in FIG. 22(b), an antenna apparatus 94 is constructed such that a shielding member 95 is located on the bottom side (wrist side). This construction is convenient for providing a conduction rubber component 93 for transmitting display drive signals to a display 92 at the opposite side from a shielding member 95 of the antenna apparatus 94.

Two (for two systems) conduction rubber components 93 are usually provided on top and bottom (or right and left) of the display 92, as shown in FIG. 22(c).

In the wristwatch type wireless apparatus 90, all the parts constituting the wristwatch type wireless apparatus 90 are accommodated in a watchcase 91.

As shown in FIG. 22(b), in this embodiment, the shielding member 95 is located at the bottom, making it suited for disposing a battery 96, which is a metal unit, in a layered fashion.

The battery 96 disposed as mentioned above is preferably set such that its orthogonal projection stays within a region wherein a ground pattern of the antenna apparatus 94 is disposed when the printed wiring board constituting the antenna apparatus 94 is regarded as a plane.

With this arrangement, the anode of the battery 96 can be connected to a circuit through the shielding member 95, permitting a smaller size to be achieved.

Seventh Embodiment

Figure 23:
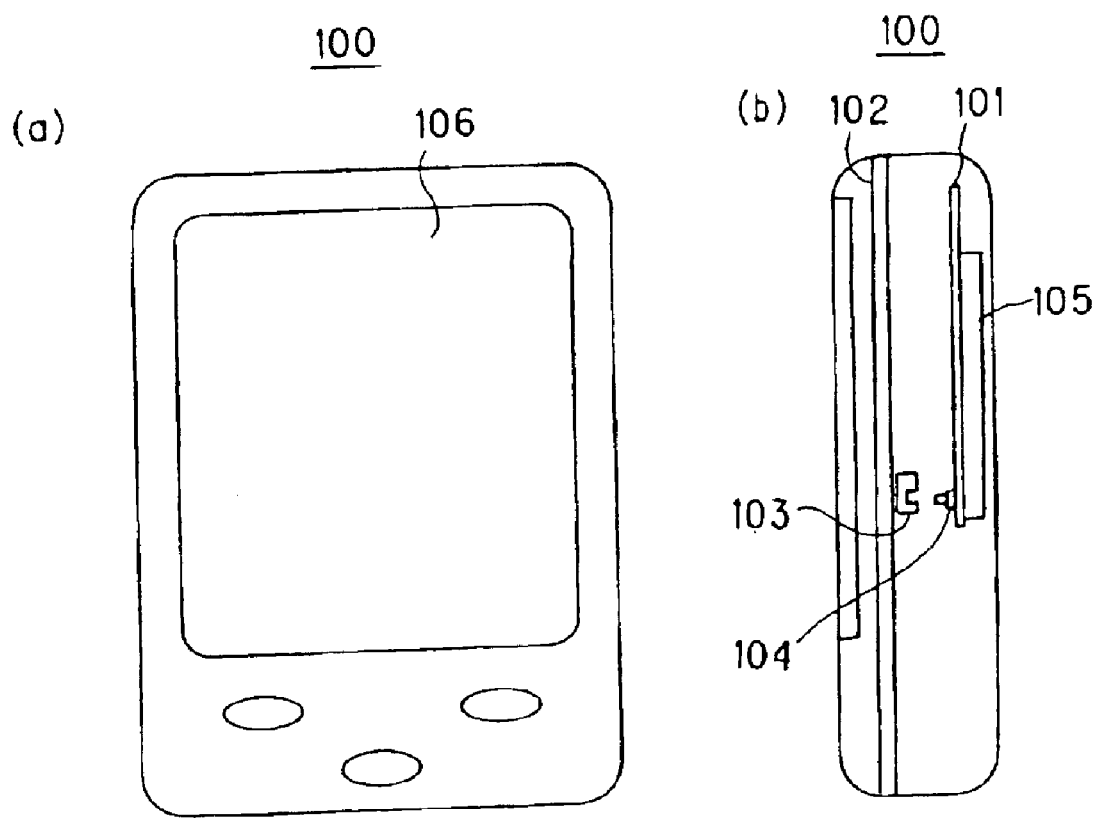
FIG. 23 is an explanatory diagram (part 1) of a configuration example of a PDA.
Figure 24:
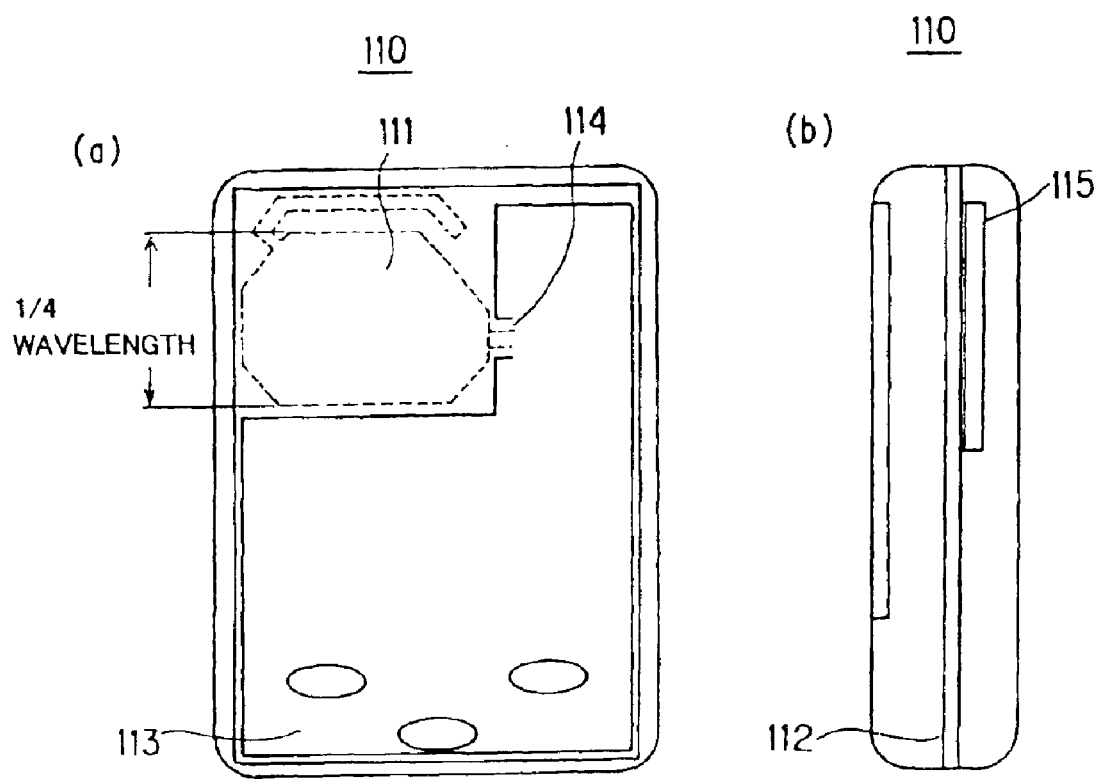
FIG. 24 is an explanatory diagram (part 2) of a configuration example of a PDA.

FIG. 23 and FIG. 24 are explanatory diagrams of the configuration examples of PDA (Personal Digital Assistant: portable information processor) 100 and 110 using the printed circuit boards described in the foregoing first through fourth embodiments and modification examples.

FIG. 23 is an explanatory diagram of a configuration example applied when an antenna apparatus 101 according to this embodiment is connected onto a circuit board 102 of the PDA 100 by a connector or the like. FIG. 23(a) is a top plan view and FIG. 23(b) is a sectional view.

The antenna apparatus 101 and the circuit board 102 are layered in the direction of thickness and connected by inter-board connectors 103 and 104. In this case, the antenna apparatus 101 and the circuit board 102 are preferably apart from each other by a predetermined distance or more. For example, a few centimeters or more is provided therebetween. For this purpose, in this embodiment, the thicknesses of the inter-board connectors 103 and 104 are appropriately set so as to set the interval between the circuit board 102 and the antenna apparatus 101 to a predetermined distance or more.

Preferably, the pattern on the circuit board 102 opposing the antenna element of the antenna apparatus 101 is not a large pattern like a ground pattern or the like.

The portion of the antenna apparatus 101 excluding the antenna element is shielded by a shielding member 105. A display 106 is provided on the front surface of the PDA 100.

FIG. 24 illustrates an layout example for building an antenna apparatus 111 in accordance with this embodiment into a circuit board 112 of the PDA 110. FIG. 24(a) is a top plan view of the PDA 110 seen through, and FIG. 24(b) is a sectional view.

A region in which the antenna apparatus 111 is to be formed is provided on the circuit board 112, and only the antenna apparatus 111 is formed in the region. An original wiring pattern of the PDA circuit 113 is formed in the remaining portion on the circuit board 112. Necessary signal lines are connected between the PDA circuit 113 and the antenna apparatus 111 only through a pattern connection portion 114. The portion of the antenna apparatus 111 excluding the antenna element is shielded by the shielding member 115. The front surface of the PDA 110 is provided with a display 116.

With this arrangement, the deterioration in the characteristics of the antenna can be minimized despite the same layout on the circuit board 112 whereon the PDA circuit 113 is formed.

Advantages of the Embodiments

According to the embodiments described above, the wavelength of an electromagnetic wave used for communication is denoted as $\lambda$, and the length L of the shielding member 13 functioning as the ground member in the predetermined directional axis X is set substantially to $\frac{1}{4}\lambda$ ($\frac{1}{4}$ wavelength). This makes it possible to reduce the size of the antenna apparatus and consequently reduce the size of the printed circuit board made integral with an antenna and a radio communication circuit, while improving antenna characteristics at the same time.

Moreover, since the shielding member is used as the ground, a ground area can be securely obtained even if the area of a printed wiring board is too small to secure an ample ground area. The apparatus can be made smaller with a higher mounting density, while restraining deterioration in antenna sensitivity.

Advantages of the Invention

According to the present invention, it is possible to reduce the size of an antenna apparatus and consequently reduce the size of a printed wiring board or a printed circuit board made integral with an antenna apparatus, while improving the characteristics of the antenna apparatus at the same time. Furthermore, a communication adapter and portable electronic equipment incorporating an antenna apparatus can be made smaller.

In addition, since the shielding member is used as the ground of an antenna, even if the area of a printed wiring board is too small to secure an ample ground area, the mounting density can be increased while restraining the deterioration in antenna sensitivity, allowing compact radio communication equipment to be made. The present invention is especially suited to applications wherein reduced sizes are desired, as in the case of wristwatch type radio communication equipment (wristwatch type portable electronic equipment).

The entire disclosure of Japanese Patent Application Nos. 2002-266323 filed Sep. 12, 2002 and 2003-157951 filed Jun. 3, 2003 are incorporated by reference.

What is claimed is:

1. An antenna apparatus comprising:
 a ground member having a length along a predetermined directional axis, the length being about a quarter or more of a wavelength of an electromagnetic wave used for communication; and
 an antenna element extending in a direction substantially orthogonal to the directional axis and connected to the ground member;
 wherein the antenna element is disposed substantially in the same plane as an end portion of the ground member with a predetermined distance provided therebetween.

2. The antenna apparatus according to claim 1, wherein:
 the antenna element comprises an antenna element main body and a feeder terminal; and
 the antenna element main body and the feeder terminal cooperatively form a ¼-wavelength inverted F antenna.

3. The antenna apparatus according to claim 1, wherein:
 the ground member further comprises a shielding member for shielding an electronic circuit.

4. The antenna apparatus according to claim 1, wherein:
 the ground member and the antenna element further comprise one piece.

5. Portable electronic equipment comprising the antenna apparatus according to claim 1.

6. The portable electronic equipment according to claim 5, wherein the portable electronic equipment further comprises a wrist watch.

7. A printed wiring board comprising:
 a ground member having a length along a predetermined directional axis, the length being about a quarter or more of a wavelength of an electromagnetic wave used for communication; and
 an antenna element extending in a direction substantially orthogonal to the directional axis and connected to the ground member;
 wherein the ground member and the antenna element are printed wirings.

8. The printed wiring board according to claim 7, wherein:
 the antenna element is disposed substantially in the same plane as an end portion of the ground member with a predetermined distance provided therebetween.

9. The printed wiring board according to claim 7, wherein:
 the antenna element comprises an antenna element main body and a feeder terminal, and
 the antenna element main body and the feeder terminal cooperatively form a ¼-wavelength inverted F antenna.

10. The printed wiring board according to claim 7, wherein:
 the ground member and the antenna element further comprise one piece.

11. A printed circuit board comprising:
 a printed wiring board;
 an electronic circuit disposed on the printed wiring board;
 a ground member having a length along a predetermined directional axis, the length being about a quarter or more of a wavelength of an electromagnetic wave used for communication; and
 an antenna element extending in a direction substantially orthogonal to the directional axis and connected to the ground members;
 wherein the antenna element is disposed substantially in the same plane as an end portion of the ground member with a predetermined distance provided therebetween.

12. The printed circuit board according to claim 11, wherein:
 the antenna element comprises an antenna element main body and a feeder terminal, and
 the antenna element main body and the feeder terminal cooperatively form a ¼-wavelength inverted F antenna.

13. The printed circuit board according to claim 11, wherein:
 the antenna element and the ground member further comprise one piece.

14. The printed circuit board according to claim 13, wherein:
 the ground member further comprises a shielding member for shielding the electronic circuit.

15. The printed circuit board according to claim 14, further comprising:
 a ground pattern formed on the printed wiring board and electrically connected to the ground member.

16. The printed circuit board according to claim 11, wherein:
 the antenna element further comprises a printed wiring on the printed wiring board; and
 the ground member is a separate component from the printed wiring board.

17. The printed circuit board according to claim 16, wherein:
 the ground member further comprises a shielding member for shielding the electronic circuit.

18. The printed circuit board according to claim 17, further comprising:
 a ground pattern formed on the printed wiring board and electrically connected to the ground member.

19. The printed circuit board according to claim 11, wherein:
 the antenna element and the ground member further comprise printed wirings on the printed wiring board.

20. A communication adapter comprising:
 a printed wiring board;
 an electronic circuit disposed on the printed wiring board;
 a ground member having a length along a predetermined directional axis, the length being about a quarter or more of the wavelength of an electromagnetic wave used for communication;

an antenna element extending in a direction substantially orthogonal to the directional axis and connected to the ground member; and a connector connection terminal;

wherein the connector connection terminal is disposed on a side toward which an antenna element main body of the antenna element extends in relation to the printed wiring board.

21. The communication adapter according to claim 20, wherein:

the antenna element further comprises a feeder terminal, and the antenna element main body and the feeder terminal cooperatively form an inverted F antenna.

* * * * *